(12) United States Patent
Yamada et al.

(10) Patent No.: US 6,445,047 B1
(45) Date of Patent: Sep. 3, 2002

(54) SEMICONDUCTOR DEVICE AND METHOD FOR FABRICATING THE SAME

(75) Inventors: Takayuki Yamada; Masaru Moriwaki, both of Osaka (JP)

(73) Assignee: Matsushita Electronics Corporation, Osaka (JP)

(*) Notice: Subject to any disclaimer, the term of this patent is extended or adjusted under 35 U.S.C. 154(b) by 0 days.

(21) Appl. No.: 09/695,381

(22) Filed: Oct. 25, 2000

(30) Foreign Application Priority Data

Oct. 26, 1999 (JP) ............................................. 11-303414

(51) Int. Cl.⁷ ............................................... H01L 29/76
(52) U.S. Cl. ....................... 257/391; 257/390; 257/383; 257/368; 257/315; 257/382
(58) Field of Search .............................. 257/368, 315, 257/382, 390, 391, 383; 438/199

(56) References Cited

U.S. PATENT DOCUMENTS 5,338,696 A * 8/1994 Ilderem et al. ............... 437/34
6,037,625 A * 3/2000 Matsubara et al. .......... 257/315
6,258,644 B1 * 7/2001 Rodder et al. ............... 438/199

* cited by examiner

*Primary Examiner*—Richard Elms
*Assistant Examiner*—Douglas Menz
(74) *Attorney, Agent, or Firm*—Nixon Peabody LLP; Donald R. Studebaker

(57) ABSTRACT

A semiconductor device includes: a first-surface-channel-type MOSFET having a first threshold voltage; and a second-surface-channel-type MOSFET with a second threshold voltage having an absolute value greater than an absolute value of said first threshold voltage. The first-surface-channel-type MOSFET includes: a first gate insulating film formed on a semiconductor substrate; and a first gate electrode, which has been formed out of a poly-silicon film over the first gate insulating film. The second-surface-channel-type MOSFET includes: a second gate insulating film formed on the semiconductor substrate; and a second gate electrode, which has been formed out of a refractory metal film over the second gate insulating film. The refractory metal film is made of a refractory metal or a compound thereof.

4 Claims, 4 Drawing Sheets

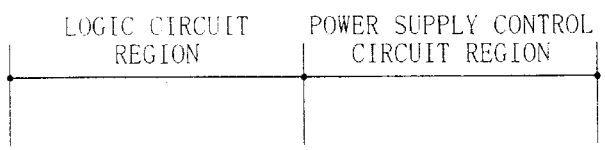
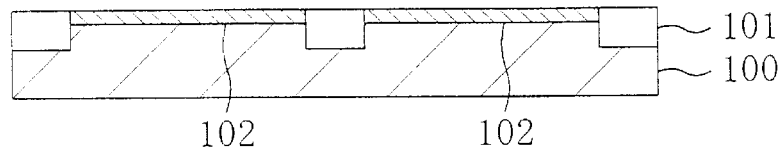
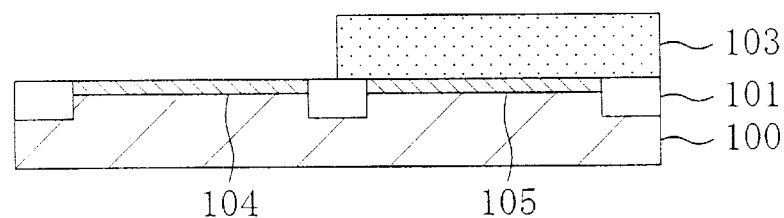
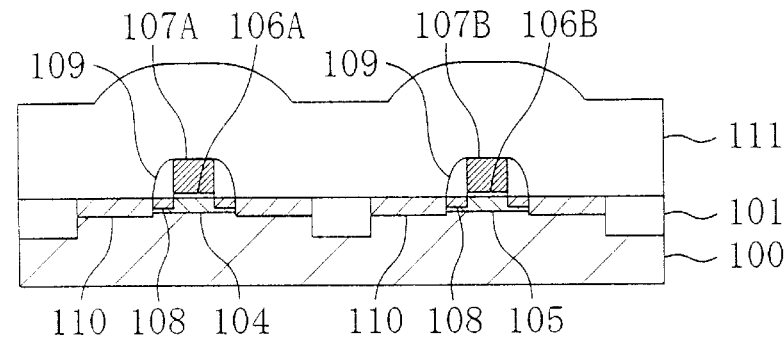
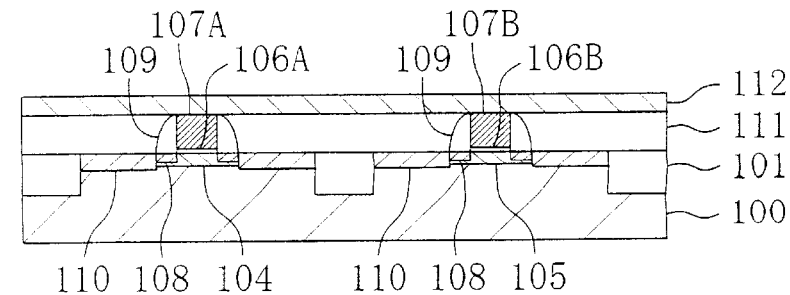

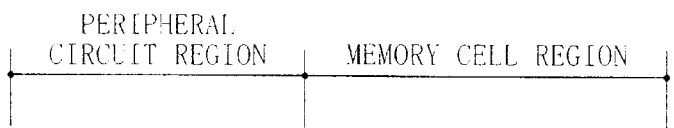
Fig. 3(a)
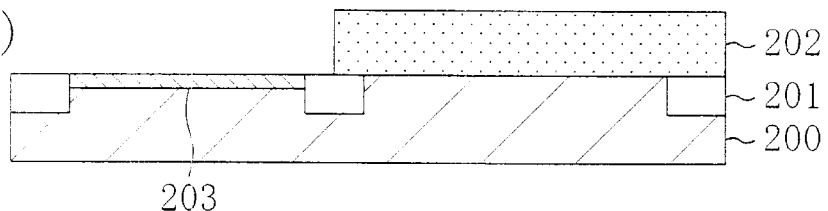
Fig. 3(b)
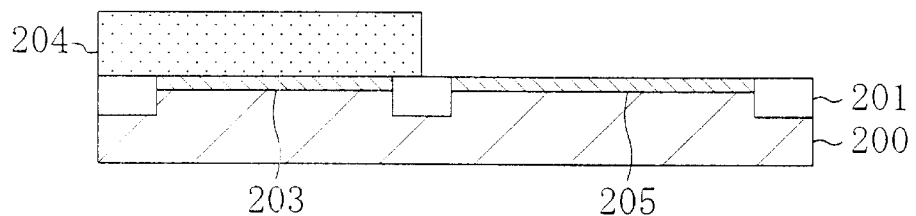
Fig. 3(c)
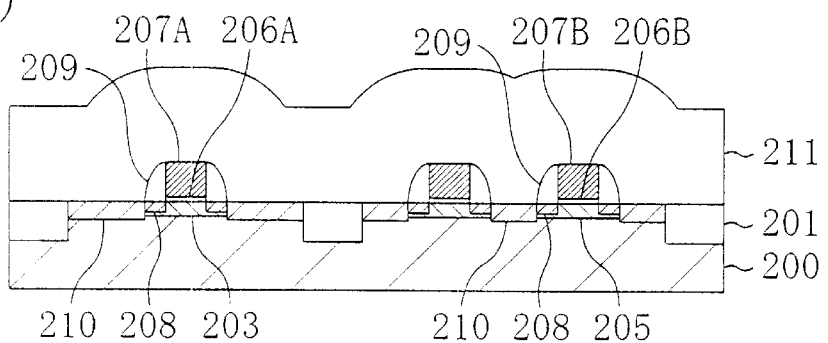
Fig. 3(d)
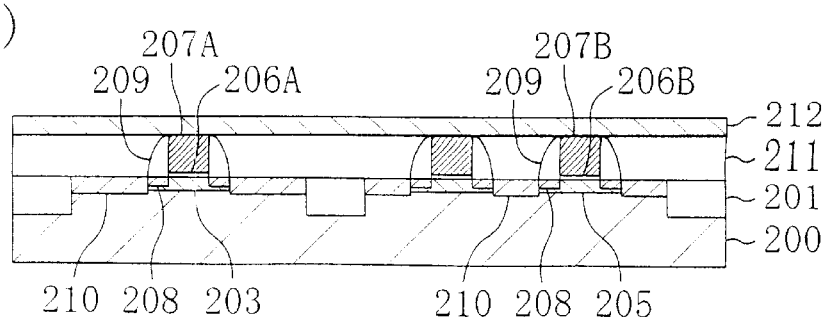

SEMICONDUCTOR DEVICE AND METHOD FOR FABRICATING THE SAME

BACKGROUND OF THE INVENTION

The present invention relates to a semiconductor device, which includes: a first-surface-channel-type MOSFET with a threshold voltage of a relatively small absolute value; and a second-surface-channel-type MOSFET with a threshold voltage of a relatively large absolute value, and also relates to a method for fabricating the device.

Performance enhancement of an MOS semiconductor device is needed typically in a system LSI, and to realize such an object, miniaturization, increasing the number of devices integrated and lowering operating voltages are required. For this purpose, it is very important to form surface-channel-type MOSFETs of multiple types on a semiconductor chip.

As a semiconductor device including multiple types of surface-channel-type MOSFETs, a device with logic circuits and DRAMs on a semiconductor chip is known. In such a semiconductor device, MOSFETs, which will be formed in a logic circuit block, should enhance their driving power by lowering the threshold voltage and increasing the saturated current value. On the other hand, MOSFETs, which will be formed in a memory cell block of DRAMs, should increase a data retention time by raising the threshold voltage value and minimizing a leakage current.

To reduce the power consumption of a logic circuit, a technique of forming an MTCMOS (Multi-Threshold CMOS) was reported. In the MTCMOS, a power supply terminal of the logic circuit block is connected to a provisional power supply line. And a voltage-regulating transistor is provided between the provisional power supply line and an original power supply line. When a logic circuit should be operated, power is supplied to the logic circuit block through the provisional power supply line by turning the voltage-regulating transistor ON. In this construction, by lowering the threshold voltage of the MOSFETs in the logic circuit block and raising the saturated current value, driving power can be increased. When the logic circuit should not be operated, power consumption of the logic circuit on standby state can be reduced by turning the voltage-regulating transistor OFF. For such a regulating transistor, lower leakage current is required. Thus, its threshold voltage is set relatively high.

As a means for forming multiple types of surface-channel-type MOSFETs with mutually different threshold voltages on a single semiconductor substrate, a technique of making the dopant concentrations in the channel regions different by implanting dopant ions at mutually different doses into the channel regions is known. Specifically, an implant dose is set higher for the channel region of a surface-channel-type MOSFET that should have a relatively high threshold voltage. In that case, since the dopant concentration in the channel region is relatively high, the threshold voltage increases.

Also, in a surface-channel-type MOSFET, a gate insulating film is thinned as a surface-channel-type MOSFET is miniaturized. Thus, to realize a predetermined threshold voltage, the dopant concentration in the channel region tends to increase.

When a surface-channel-type MOSFET with a relatively high threshold voltage is formed, performance degrades, as the dopant concentration in the channel region gets higher.

For example, if the dopant concentration in the channel region is raised, a leakage current flowing through the pn junction might increase. Consequently, if a MOSFET with a heavily doped channel region is used for a memory cell of a DRAM, data retention time might be shortened. Also, a channel region with an increased dopant concentration can increase the scattering of the dopant in the channel region, which results in decrease of carrier mobility.

Moreover, if a MOSFET with the heavily doped channel region is used as a voltage-regulating transistor for an MTCMOS, ON-state current characteristics might degrade (or increase an ON-state resistance). Therefore, the voltage of a provisional power supply line decreases, thus deteriorating the performance of the logic circuit.

SUMMARY OF THE INVENTION

It is therefore an object of the present invention to enhance the performance of a surface-channel-type MOSFET with a higher threshold voltage in a semiconductor device including multiple types of surface-channel-type MOSFETs with mutually different threshold voltages.

To achieve this object, an inventive semiconductor device includes: a first-surface-channel-type MOSFET with a threshold voltage of a relatively small absolute value; and a second-surface-channel-type MOSFET with a threshold voltage of a relatively large absolute value. The first-surface-channel-type MOSFET includes: a first gate insulating film formed on a semiconductor substrate; and a first gate electrode, which has been formed out of a polysilicon film over the first gate insulating film. The second-surface-channel-type MOSFET includes: a second gate insulating film formed on the semiconductor substrate; and a second gate electrode, which has been formed out of a refractory metal film over the second gate insulating film. The refractory metal film is made of a refractory metal or a compound thereof.

In the inventive device, the second gate electrode of the second-surface-channel-type MOSFET is made of a refractory metal or a compound thereof that has a work function corresponding to the intermediate level of the energy gap of silicon. Therefore, the second-surface-channel-type MOSFET can have the absolute value of its threshold voltage increased without raising the dopant concentration in the channel region of the second-surface-channel-type MOSFET. As a result, the second-surface-channel-type NMOS transistor can enhance the OFF-state leakage current characteristics and minimize a leakage current flowing through its pn junction. In addition, the transistor can enhance the ON-state current characteristics to reduce the ON-state resistance.

In one embodiment of the present invention, a dopant concentration in the channel region of the second-surface-channel-type MOSFET is preferably lower than a dopant concentration in the channel region of the first-surface-channel-type MOSFET.

In this manner, the OFF-state leakage current characteristics and the ON-state current characteristics of the second-surface-channel-type MOSFET can be further improved.

In another embodiment of the present invention, the first-surface-channel-type MOSFET is preferably formed in a logic circuit block of the semiconductor substrate, and the second-surface-channel-type MOSFET preferably controls power to be supplied to the logic circuit block.

In such an embodiment, the first-surface-channel-type MOSFET formed in the logic circuit block can increase its driving power, because the MOSFET can have the absolute value of its threshold voltage decreased and its saturated current value raised. In addition, the second-surfacechannel-type MOSFET that controls the power to be supplied to the logic circuit block can improve its ON-state current characteristics.

In still another embodiment of the present invention, the first-surface-channel-type MOSFET is preferably formed in a logic circuit block of the semiconductor substrate, and the second-surface-channel-type MOSFET is preferably formed in a memory cell block of the semiconductor substrate. And the second gate insulating film is preferably thicker than the first gate insulating film.

In this manner, the second-surface-channel-type MOSFET can enhance its OFF-state leakage current characteristics and therefore extend a pause time (i.e., a period of time for which charge is stored in a single memory cell), which is usually shortened by the leakage current. As a result, the storage characteristics are improved significantly.

An inventive method is a method for fabricating a semiconductor device including: a first-surface-channel-type MOSFET with a threshold voltage of a relatively small absolute value; and a second-surface-channel-type MOSFET with a threshold voltage of a relatively large absolute value. The method includes the steps of: a) introducing a dopant into regions of a semiconductor substrate where first and second gate electrodes will be formed for the first and second-surface-channel-type MOSFETS, respectively; b) depositing a first insulating film and a polysilicon film in this order over the semiconductor substrate; c) patterning the polysilicon film and the first insulating film, thereby forming the first gate electrode and a dummy gate electrode out of the polysilicon film for the first and second-surface-channel-type MOSFETS, respectively, and a first gate insulating film and a dummy gate insulating film out of the first insulating film for the first and second-surface-channel-type MOSFETs, respectively; d) forming sidewalls covering the first gate electrode and the dummy gate electrode, respectively; e) depositing an interlayer dielectric film over the entire surface of the semiconductor substrate and then removing parts of the interlayer dielectric film, which are located over the first gate electrode and the dummy gate electrode, respectively, thereby exposing the first gate electrode and the dummy gate electrode; f) defining a mask pattern, which covers the first gate electrode but exposes the dummy gate electrode, over the interlayer dielectric film and then etching the dummy gate electrode and the dummy insulating film away using the mask pattern, thereby forming a recess inside the sidewall of the dummy gate electrode; g) forming a second gate insulating film for the second-surface-channel-type MOSFET on part of the surface of the semiconductor substrate that has been exposed inside the recess; h) depositing a refractory metal film, which is made of a refractory metal or a compound thereof, over the entire surface of the semiconductor substrate; and i) removing the refractory metal film, except for its part filled in the recess, thereby forming the second gate electrode out of the refractory metal film for the second-surface-channel-type MOSFET.

According to the inventive method, a first gate electrode for a first-surface-channel-type MOSFET is formed out of a polysilicon film. In addition, a second gate electrode for a second-surface-channel-type MOSFET is formed in a recess after a dummy electrode has been removed. The second gate electrode is formed out of a refractory metal film made of a refractory metal or a compound thereof. In this manner, the first-surface-channel-type MOSFET, including the first gate electrode made of the polysilicon film, and the second-surface-channel-type MOSFET, including the second gate electrode made of the refractory metal film, are obtained.

Thus, the second-surface-channel-type MOSFET can have the absolute value of its threshold voltage increased without raising the dopant concentration in the channel region of the second-surface-channel-type MOSFET.

Thus, according to the inventive method, it is possible to enhance the OFF-state leakage current characteristics and the ON current characteristics of the second-surface-channel-type NMOS transistor in fabricating the semiconductor device.

In one embodiment of the present invention, the process of introducing a dopant preferably includes the steps of: introducing the dopant at a relatively high concentration into the region of the semiconductor substrate in which the first gate electrode will be formed; and introducing the dopant at a relatively low concentration into the region of the semiconductor substrate in which the second gate electrode will be formed.

In such an embodiment, the dopant concentration in the channel region of the second-surface-channel-type MOSFET is lower than the dopant concentration in the channel region of the first-surface-channel-type MOSFET. As a result, the OFF-state leakage current characteristics and the ON-state current characteristics of the second-surface-channel-type MOSFET are further improved.

BRIEF DESCRIPTION OF THE DRAWINGS

FIGS. 1A through 1D are cross-sectional views illustrating respective process steps for fabricating a semiconductor device according to a first embodiment of the present invention.

FIGS. 3A through 3D are cross-sectional views illustrating respective process steps for fabricating a semiconductor device according to a second embodiment of the present invention.

DESCRIPTION OF THE PREFERRED EMBODIMENTS

EMBODIMENT 1

Figure 2A:
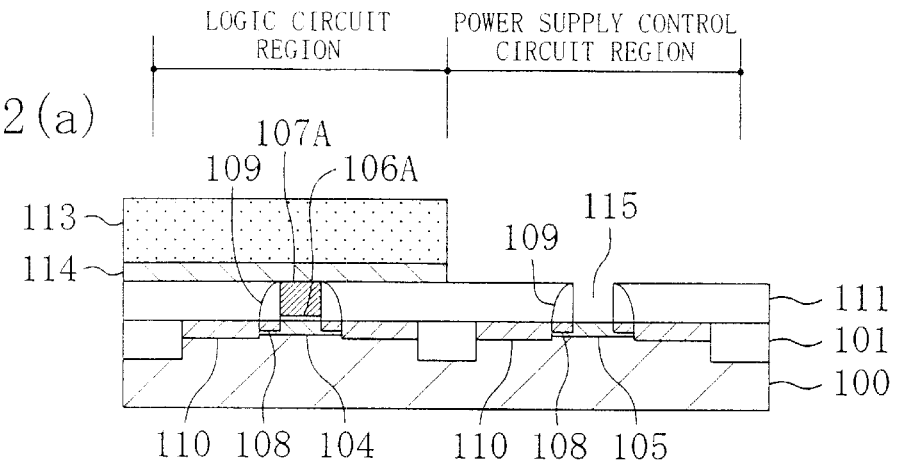
FIGS. 2A through 2C are cross-sectional views illustrating respective process steps for fabricating the semiconductor device of the first embodiment.

Hereinafter, a semiconductor device and a fabrication process thereof according to a first embodiment of the present invention will be described with reference to FIGS. 1A through 1D and FIGS. 2A through 2C. It should be noted that in FIGS. 1A through 2C, a first NMOS transistor is formed in a logic circuit region on the left side, while a second NMOS transistor is formed in a power supply control circuit (i.e., a circuit that provides a supply voltage to the logic circuit) region on the right side.

First, as shown in FIG. 1A, isolation regions 101 are formed on a p-type semiconductor substrate 100 of silicon. Then, a first ion implantation process is performed. Specifically, ions of a p-type dopant (e.g., boron) are implanted into the regions where the first and second NMOS transistors will be formed at an implant energy of 30 keV and an implant dose of $1 \times 10^{12}/cm^{-2}$, for example, thereby forming p-type doped regions 102.

Next, as shown in FIG. 1B, a resist mask 103 is formed to cover the region where the second NMOS transistor will be formed. Then, a second ion implantation is performed.

Specifically, ions of a p-type dopant (e.g., boron) are implanted into the region where the first NMOS transistor will be formed at an implant energy of 30 keV and an implant dose of $4 \times 10^{12}/cm^{-2}$. As a result, a first p-type doped region 104 that will have a relatively high dopant concentration in its channel region is formed in the region where the first NMOS transistor will be formed. In addition, a second p-type doped region 105 that will have a relatively low dopant concentration in its channel region is formed in the region where the second NMOS transistor will be formed. It should be noted that the second p-type doped region 105 is the same as the p-type doped regions 102.

Then, as shown in FIG. 1C, a silicon dioxide film with a thickness of 2.5 nm, for example, and an n-type polysilicon film are formed over the semiconductor substrate 100 in this order. And by patterning the silicon dioxide film and the n-type polysilicon film, a first gate insulating film 106A and a first gate electrode 107A are formed in the region where the first NMOS transistor will be formed, while a dummy gate insulating film 106B and a dummy gate electrode 107B are formed in the region where the second NMOS transistor will be formed. The next step is implanting n-type dopant ions using the first gate electrode 107A and dummy gate electrode 107B s as a mask. As a result, n-type lightly doped regions 108 are formed. Thereafter, sidewalls 109 are formed on the sides of the first gate electrode 107A and dummy gate electrode 107B. Then, by implanting n-type dopant ions using the first gate electrode 107A, dummy gate electrode 107B and sidewalls 109 as a mask, n-type heavily doped regions 110 are formed. Next, an interlayer dielectric film 111 made of a silicon dioxide film is deposited, by a CVD process, for example, to a thickness of 400 nm, for example.

Then, as shown in FIG. 1D, the interlayer dielectric film 111 is planarized by a CMP process, for example, to expose the upper surfaces of the first gate electrode 107A and dummy gate electrode 107B. And a silicon nitride film 112 is deposited to a thickness of 50 nm, for example, over the entire surface of the semiconductor substrate 100.

Next, as shown in FIG. 2A, a second resist mask 113 is formed on the silicon nitride film 112 to cover the region where the first NMOS transistor will be formed. And then, the silicon nitride film 112 is patterned using the second resist mask 113 to form a hard mask 114 out of the silicon nitride film 112.

Thereafter, the dummy gate electrode 107B is removed by a wet-etching process using an echant (e.g., an alkaline solution such as a KOH) to open a recess 115 for forming a gate electrode. And then, the dummy gate insulating film 106B that remains on the bottom of the recess 115 is removed by a wet-etching process using an etchant (e.g., a HF solution). The dummy gate electrode 107B and dummy gate insulating film 106B are removed using the hard mask 114 as a mask. In this manner, the semiconductor substrate 100 has a part of its surface exposed.

Figure 2B:
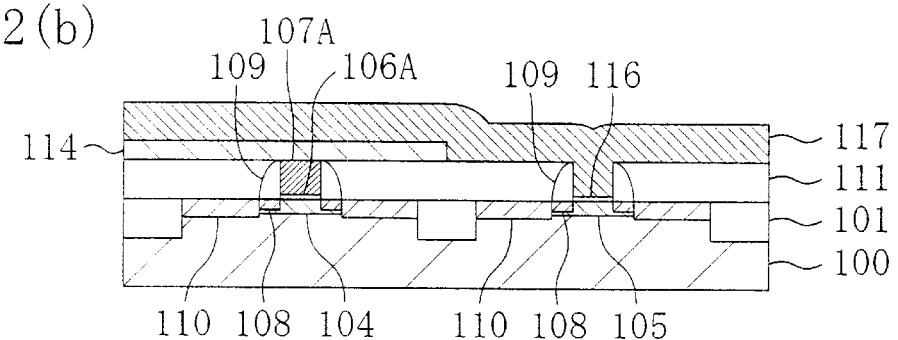

Subsequently, as shown in FIG. 2B, a second gate insulating film 116 of silicon dioxide film is formed to a thickness of 2.5 nm, for example, on the bottom of the recess 115. Then, a refractory metal film 117 made of TiN, for example, is deposited by a CVD process, for example, to fill in the recess 115.

Figure 2C:
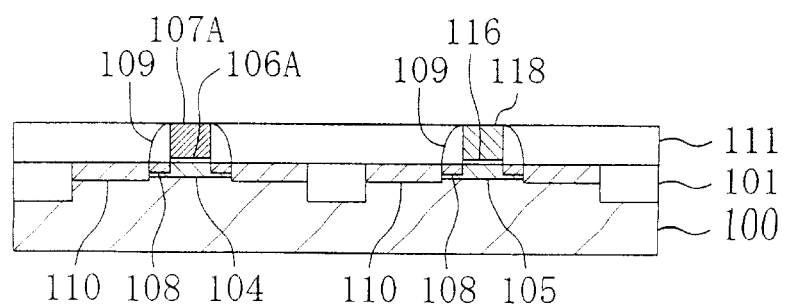

The next step is planarizing the refractory metal film 117 by a CMP process, for instance, until the first gate electrode 107A exposes its upper surface. As a result, the second gate electrode 118 is formed as shown in FIG. 2C. It should be noted that, in the planarizing process, a slurry of the type eliminating selectivity between the refractory film 117 and hard mask (silicon nitride film) 114 is preferably used.

Then, metal interconnects are defined by a known process. As a result, the first NMOS transistor is obtained in the logic circuit region, while the second NMOS transistor is obtained in the power supply control circuit region.

According to the first embodiment, the first surface-channel-type NMOS transistor, including the first gate electrode 107A made of a polysilicon film, can be formed in the logic circuit region. And the second surface-channel-type NMOS transistor, including the second gate electrode 118 made of the refractory metal film 117, can be formed in the power supply control circuit region. The refractory metal film may be made of TiN, for example.

A refractory metal such as TiN or a compound thereof has a work function corresponding to the intermediate level of the energy gap of silicon. Therefore, a surface-channel-type NMOS transistor with a gate electrode made of a refractory metal or a compound thereof has a threshold voltage higher than that of a surface-channel-type NMOS transistor with a gate electrode made of a polysilicon film by about 0.5 v to about 0.6 V. when their channel doping profiles are the same.

The implant dose ($1 \times 10^{12}/cm^{-2}$) for the second p-type doped region 105 of the second-surface-channel-type NMOS transistor, including the second gate electrode 118 made of a refractory metal or its compound, is lower than the implant dose ($4 \times 10^{12}/cm^{-2}$) for the first p-type doped region 104 of the first-surface-channel-type NMOS transistor, including the first gate electrode made of a poly-silicon film, However, the threshold voltage of the second-surface-type NMOS transistor (around 0.5 V) can be higher than the threshold (around 0.2 V), In other words, the dopant concentration in second p-type doped region 105 of the second-surface-channel-type NMOS transistor, which has a threshold voltage with a relatively large absolute value, can be lower than the dopant concentration in the first p-type doped region 104 of the first-surface-channel-type NMOS transistor, which has a threshold voltage with a relatively small absolute value. Thus, the second-surface-channel-type NMOS transistor can enhance its OFF-state leakage current characteristics and reduce the leakage current flowing through its pn junction. In addition, the second-surface-channel-type NMOS transistor can enhance its ON-state current characteristics to reduce the ON-state resistance.

It should be noted that, according to the first embodiment, the second gate electrode 118 of the second-surface-channel-type NMOS transistor is made of the refractory metal like TiN. Alternatively, the second gate electrode 118 may be a single-layer film made of a refractory metal such as tungsten, moleybdenum, or tantalum or a compound thereof. Also, the second gate electrode 118 may have a multilayer structure. The lower film of the multilayer structure may be made of a refractory metal such as tungsten or titanium or compound thereof, and the upper film of the multilayer structure may be made of a metal with a low resistivity such as aluminum or copper.

EMBODIMENT 2

Hereinafter, a semiconductor device and a fabrication process thereof according to a second embodiment of the present invention will be described with reference to FIGS. 3A through 3D and FIGS. 4A through 4C. It should be noted that in FIGS. 3A through 4C, a first NMOS transistor is formed in a peripheral circuit region on the left side, while second NMOS transistors are formed in a memory cell region on the right side.

First, as shown in FIG. 3A, isolation regions 201 are formed on a p-type semiconductor substrate 200 of silicon. Then, a first resist mask 202 is formed to cover the region where the second NMOS transistors will be formed. Thereafter, a first ion implantation process is performed. Specifically, using the first resist mask 202, ions of a p-type dopant (e.g., boron) are implanted at an implant energy of 30 keV and an implant dose of $4 \times 10^{12}/cm^{-2}$, for example, thereby forming a first p-type doped region 203, which will have a relatively high dopant concentration in its channel region, in the region where the first NMOS transistor will be formed.

Next, as shown in FIG. 3B, a second resist mask 204 is formed to cover the region where the first NMOS transistor will be formed. Then, a second ion implantation is performed. Specifically, using the second resist mask 204 ions of a p-type dopant (e.g., boron) are implanted at an implant energy of 30 kev and an implant dose of $1 \times 10^{12}/cm^{-2}$. As a result, a second p-type doped region 205 that will have a relatively low dopant concentration in its channel region is formed in the region where the second NMOS transistors will be formed.

Then, as shown in FIG. 3C, a first silicon dioxide film with a thickness of 2.5 nm, for example, and an n-type polysilicon film are formed over the semiconductor substrate 200 in this order. And by patterning the first silicon dioxide film and the n-type polysilicon film, a first gate insulating film 206A and a first gate electrode 207A are formed in the region where the first NMOS transistor will be formed, while a dummy gate insulating film 206B and dummy gate electrodes 207B are formed in the region where the second NMOS transistor will be formed. The next step is implanting n-type dopant ions using the first gate electrode 207A and dummy gate electrodes 207B as a mask. As a result, n-type lightly doped regions 208 are formed. Thereafter, sidewalls 209 are formed on the sides of the first gate electrode 207A and dummy gate electrodes 207B. Then, by implanting n-type dopant ions using the first gate electrode 207A, dummy gate electrodes 207B and sidewalls 209 as a mask, n-type heavily doped regions 210 are formed. Next, an interlayer dielectric film 211 made of a silicon dioxide film is deposited, by a CVD process, for example, to a thickness of 400 nm, for example.

Then, as shown in FIG. 3D, the interlayer dielectric film 211 is planarized by a CMP process, for example, to expose the upper surfaces of the first gate electrode 207A and dummy gate electrodes 207B. And a silicon nitride film 212 is deposited to a thickness of 50 nm, for example, over the entire surface of the semiconductor substrate 200.

Figure 4A:
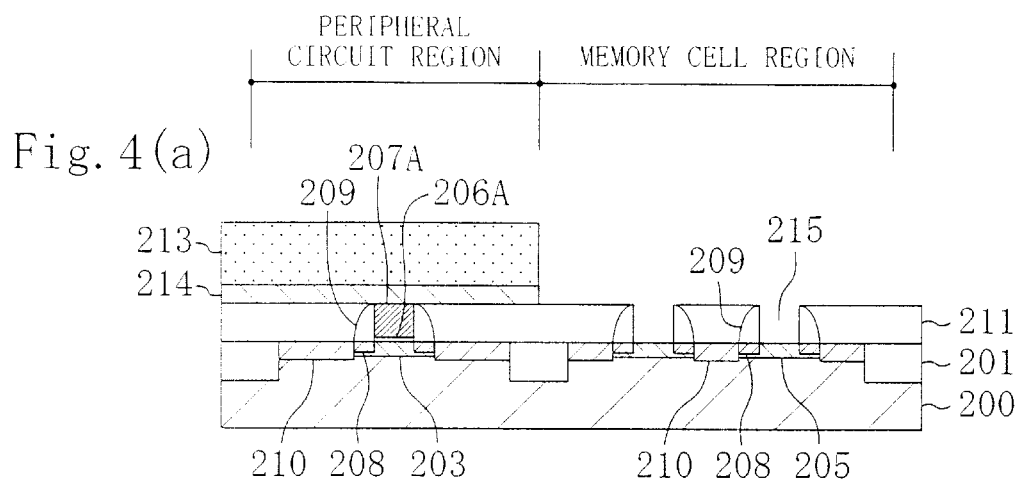
FIGS. 4A through 4C are cross-sectional views illustrating respective process steps for fabricating the semiconductor device of the second embodiment.

Next, as shown in FIG. 4A, a third resist mask 213 is formed on the silicon nitride film 212 to cover the region where the first NMOS transistor will be formed. And then, the silicon nitride film 212 is patterned using the third resist mask 213 to form a hard mask 214 out of the silicon nitride film 212.

Thereafter, the dummy gate electrodes 207B are removed by a wet-etching process using an echant (e.g., an alkaline solution such as a KOH) to open recesses 215 for forming gate electrodes. And then, the dummy gate insulating film 206B that remains on the bottom of the recesses 215 is removed by a wet-etching process using an etchant (e.g., an HF solution). The dummy gate electrodes 207B and dummy gate insulating film 206B are removed using the hard mask 214 as a mask. In this manner, the semiconductor substrate 200 has a part of its surface exposed.

Figure 4B:
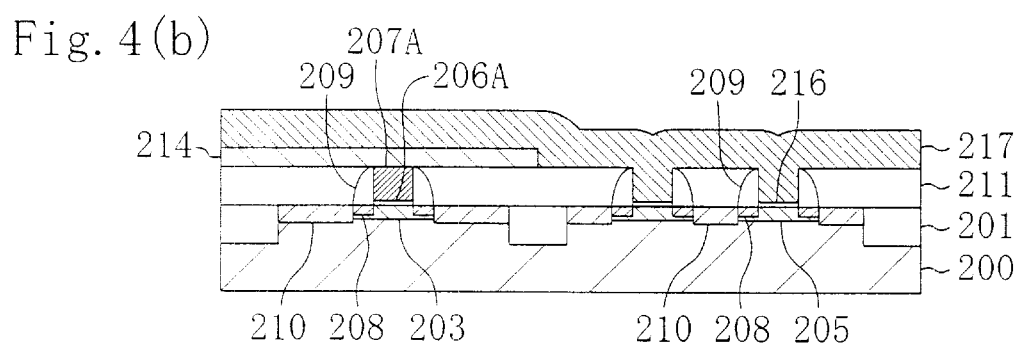

Subsequently, as shown in FIG. 4B, a second gate insulating film 216 of a silicon dioxide film is formed to a thickness of 5 nm, for example, on the bottom of the recesses 215. Then, a refractory metal film 217 made of W, for example, is deposited by a CVD process, for example, to fill in the recesses 215.

Figure 4C:
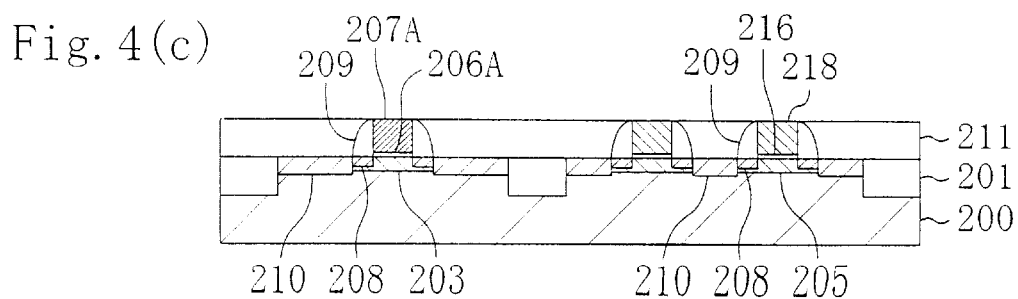

The next step is planarizing the refractory metal film 217 by a CMP process, for instance, until the first gate electrode 207A exposes its upper surface. As a result, the second gate electrodes 218 are formed as shown in FIG. 4C. It should be noted that, in the planarizing process, a slurry of the type eliminating selectivity between the refractory film 217 and hard mask (silicon nitride film) 214 is preferably used.

Then, metal interconnects are defined by a known process. As a result, the first NMOS transistor is obtained in the peripheral circuit region, while the second NMOS transistors are obtained in the memory cell region.

According to the second embodiment, the first-surface-channel-type NMOS transistor including the first gate insulating film 206A is formed in the peripheral circuit region, and the first gate insulating film 206A is made of the first silicon dioxide film with a relatively small thickness of 2.5 nm, for example. On the other hand, the second-surface-channel-type MOS transistors including the second gate insulating film 206B are formed in the memory cell region, and the second gate insulating film 206B is made of the second silicon dioxide film with a relatively large thickness of 5 nm, for example.

Also, the first surface-channel-type NMOS transistor, which includes the first gate electrode 207A made of an n-type polysilicon film and has a threshold voltage with a relatively small absolute value, is formed in the peripheral circuit region. On the other hand, the second surface-channel-type NMOS transistors, which include the second gate electrodes 218 made of W having a work function corresponding to the intermediate level of the energy gap of silicon and which have a threshold voltage with a relatively large absolute value, are formed in the memory cell region.

Therefore, the second surface-channel-type NMOS transistors with a threshold voltage of a relatively large absolute value have the channel regions that are the second p-type doped regions 205 with a relatively low dopant concentration. Thus, the second surface-channel-type NMOS transistors can have their OFF-state leakage current characteristics improved. In addition, a pause time (i.e., a period of time for which charge is stored in a single memory cell), which is usually shortened by the leakage current, can be extended because the second-surface-channel-type NMOS transistors have the relatively thick second gate insulating film 208B. As a result, the storage characteristics of the second-surface-channel-type NMOS transistors improve significantly.

It should be noted that, according to the first and second embodiments, the first- /and second-surface-channel-type MOS transistors are n-channel transistors. However, the first- and second-surface-channel-type MOS transistors may be p-channel transistors as well. The process of forming the surface-channel-type PMOS transistors may be the same as that of forming the surface-channel-type NMOS transistors.

What is claimed is:

1. A semiconductor device comprising:
   a first-surface-channel-type MOSFET with a first threshold voltage; and
   a second-surface-channel-type MOSFET with a second threshold voltage having an absolute value greater than an absolute value of said first threshold voltage,
   wherein the first-surface-channel-type MOSFET includes:
      a first gate insulating film formed on a semiconductor substrate; and a first gate electrode, which has been formed out of a poly-silicon film formed directly on the first gate insulating film, and wherein the second-surface-channel-type MOSFET includes:
   a second gate insulating film formed on the semiconductor substrate; and
   a second gate electrode, which has been formed out of a refractory metal film formed directly on the second gate insulating film, the refractory metal film being made of a refractory metal or a compound thereof.

2. The device of claim 1, wherein a dopant concentration in the channel region of the second-surface-channel-type MOSFET is lower than a dopant concentration in the channel region of the first-surface-channel-type MOSFET.

3. The device of claim 1, wherein the first-surface-channel-type MOSFET is formed in a logic circuit block of the semiconductor substrate, and wherein the second-surface-channel-type MOSFET controls power to be supplied to the logic circuit block.

4. The device of claim 1, wherein the first-surface-channel-type MOSFET is formed in a logic circuit block of the semiconductor substrate, and wherein the second-surface-channel-type MOSFET is formed in a memory cell block of the semiconductor substrate, and wherein the second gate insulating film is thicker than the first gate insulating film.

* * * * *

UNITED STATES PATENT AND TRADEMARK OFFICE
CERTIFICATE OF CORRECTION

PATENT NO.     : 6,445,047 B1
DATED          : September 3, 2002
INVENTOR(S)    : Takayuki Yamada et al.

It is certified that error appears in the above-identified patent and that said Letters Patent is hereby corrected as shown below:

<u>Title page,</u>
Item [73], Assignee, delete "Matsushita Electronics Corporation" add
-- Matsushita Electric Industrial Co., Ltd. --.

Signed and Sealed this

Eighteenth Day of March, 2003

JAMES E. ROGAN
*Director of the United States Patent and Trademark Office*